US006795319B2

(12) United States Patent
Preston et al.

(10) Patent No.: US 6,795,319 B2
(45) Date of Patent: Sep. 21, 2004

(54) INTRINSICALLY SAFE PORTABLE PROGRAMMER FOR ENCLOSED ELECTRONIC PROCESS CONTROL EQUIPMENT

(75) Inventors: Nigel Ashley Preston, Peterborough (CA); Robert William Gray, Peterborough (CA)

(73) Assignee: Siemens Milltronics Process Instruments, Inc., Ontario (CA)

( * ) Notice: Subject to any disclaimer, the term of this patent is extended or adjusted under 35 U.S.C. 154(b) by 0 days.

(21) Appl. No.: 09/811,668

(22) Filed: Mar. 20, 2001

(65) Prior Publication Data

US 2002/0135989 A1 Sep. 26, 2002

(51) Int. Cl.$^{7}$ .................................................. H05K 5/06
(52) U.S. Cl. ...................................... 361/752; 73/290 R
(58) Field of Search ................................ 361/752, 737; 73/149, 304 R, 304 C, 200, 291, 290 R, 195, 198; 250/504.4, 900; 340/618, 539, 870.16, 870.11, 854.6; 324/124

(56) References Cited

U.S. PATENT DOCUMENTS 3,910,116 A 10/1975 Smith
4,831,565 A * 5/1989 Woodward .................. 702/103
5,163,323 A 11/1992 Davidson
5,166,238 A * 11/1992 Nakano et al. ............. 524/120
5,313,365 A * 5/1994 Pennisi et al. .............. 361/760
5,519,527 A 5/1996 Panton et al.
5,723,870 A * 3/1998 Crowne et al. ............. 250/577
5,847,567 A 12/1998 Kielb et al.
5,954,526 A 9/1999 Smith
6,097,306 A * 8/2000 Leon et al. ............ 340/825.31
6,166,630 A 12/2000 King
6,634,228 B2 * 10/2003 Deserno et al. ........... 73/290 V

* cited by examiner

*Primary Examiner*—Phuong T. Vu
(74) *Attorney, Agent, or Firm*—Birch, Stewart, Kolasch & Birch, LLP

(57) ABSTRACT

An intrinsically safe portable programmer for communicating with the electronic process control equipment over a wireless communication link. The portable programmer comprises a microprocessor controlled electronic circuit housed in an enclosure formed from a polymers polystyrene having a low surface resistivity. The electronic circuit is mounted inside the enclosure with a low voltage battery supply and encased in epoxy to prevent sparking. The electronic circuit includes an infrared transmitter and a keypad. In response to keypad inputs, the electronic circuit generates control signals which are transmitted to the electronic process control equipment via the infrared transmitter.

15 Claims, 3 Drawing Sheets

INTRINSICALLY SAFE PORTABLE PROGRAMMER FOR ENCLOSED ELECTRONIC PROCESS CONTROL EQUIPMENT

FIELD OF THE INVENTION

The present invention relates to enclosed electronic process control equipment, and more particularly to an intrinsically safe portable programmer for communicating with the electronic process control equipment without electrical connection between the two.

BACKGROUND OF THE INVENTION

Level measurement systems are one type of electronic process control device. Level measurement systems, also known as time of flight ranging systems, determine the distance to a reflector or reflective surface (e.g. the level of a liquid held in a storage tank) by measuring how long after transmission of a burst of energy pulses, the echo is received. Such systems typically utilize ultrasonic pulses, pulse radar signals, or microwave energy signals. Level measurement systems find widespread application in many different types of process control applications in a wide variety of diverse applications, such as the petroleum industry and the food industry.

Industrial process control applications in hazardous environments, such as the petroleum industry, often require the electronic process control equipment to be installed as enclosed devices for safety reasons. Once installed, the enclosed devices are inaccessible even for purposes of routine maintenance, programming and calibration. To access the device, the industrial process or processes operating in the work space must be disabled and the area deemed declassified, and only then can the electronic process control equipment be opened for maintenance or reprogramming.

The programming, calibration, and/or configuration of such electronic process control equipment is often performed using an on-board keypad or control panel. The keypad is accessed by opening the device after the industrial process and work space have been disabled and declassified. It will be appreciated that while the keypad is a necessary component to provide the capability for configuring, calibrating, and re-programming the device, the keypad is a component which does add to the cost of the device. In the case of enclosed electronic process control devices in hazardous environments, the switches or pushbuttons for the keypad must be explosion proof which adds further to the cost of the electronic process control device. Furthermore, the declassifying operation for a hazardous area is both time consuming and costly.

Accordingly, there remains a need for an apparatus which would facilitate the programming of enclosed electronic process control devices in a hazardous area.

BRIEF SUMMARY OF THE INVENTION

The present invention provides an intrinsically safe portable or handheld programming device suitable for enclosed electronic process control equipment, such as level measurement devices.

In a first aspect, the present invention provides an intrinsically safe portable device for configuring the operation of electronic process control equipment, the electronic process control equipment includes a wireless communication receiver, the portable device comprises: (a) an enclosure; (b) an electronic circuit mounted in the enclosure; (c) a keypad coupled to the electronic circuit; (d) a wireless transmitter responsive to the electronic circuit and operative to transmit control signals to the wireless communication receiver on the electronic process control equipment for controlling the operation of the electronic process control equipment; (e) the electronic circuit includes a low voltage power supply and a low power microcontroller for operating at a low voltage level to eliminate the incidence of sparking.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Reference will now be made to the accompanying drawings, which show, by way of example, a preferred embodiment of the present invention, and in which.

DETAILED DESCRIPTION THE PREFERRED EMBODIMENT

Figure 1:
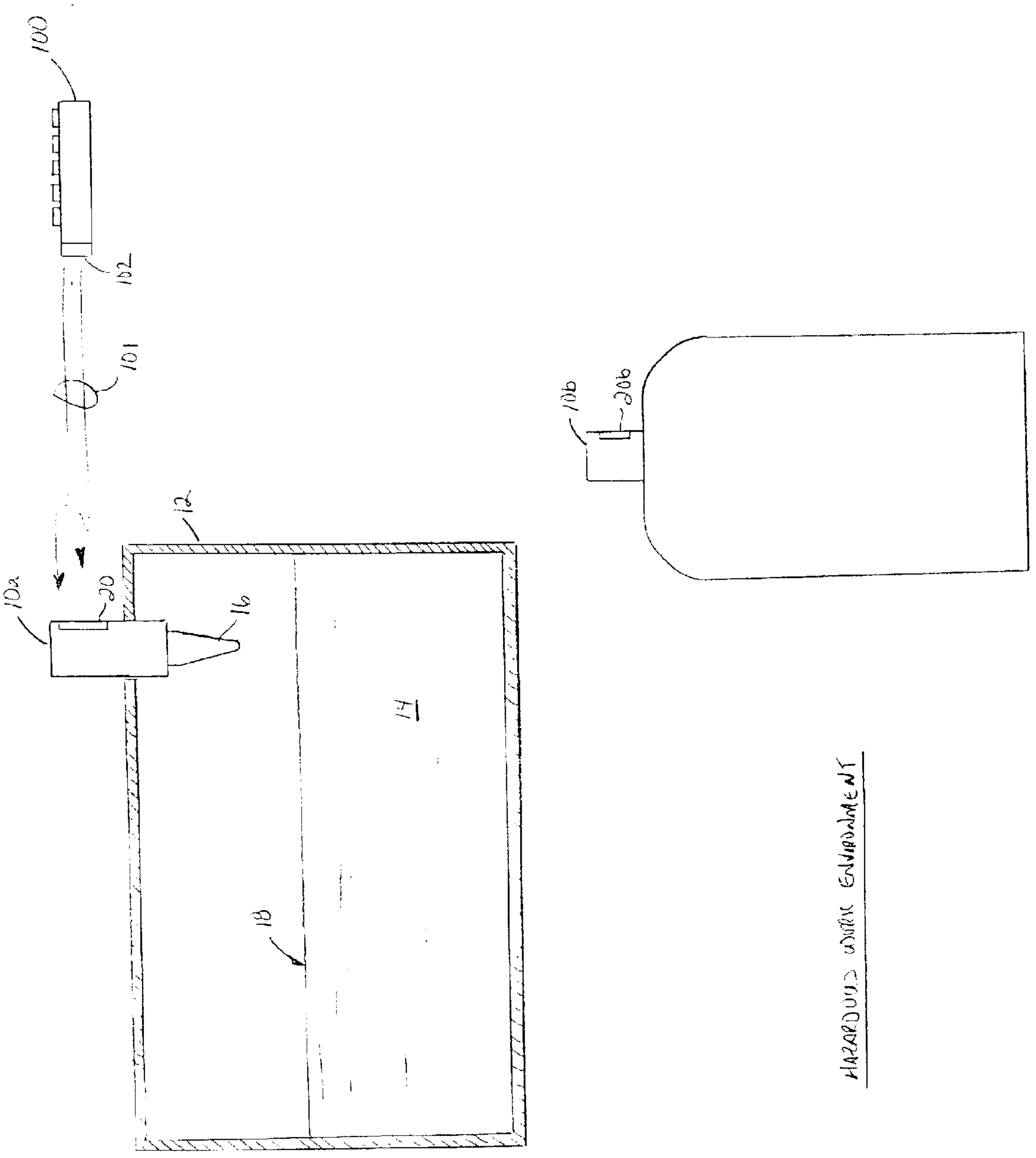
FIG. 1 is a block diagram of a level measurement system and an intrinsically safe handheld programmer according to the present invention.

Reference is first made to FIG. 1 which shows an intrinsically safe portable or handheld programmer 100 according to the present invention in conjunction with a level measurement instrument 10 in a typical hazardous industrial application. While the intrinsically safe handheld programmer 100 is described in the context of a level measurement instrument 100, it is to be appreciated that the handheld programmer 100 has wider applicability to other types of electronic process control equipment.

With reference to FIG. 1, the level measurement instrument 10 is installed on a storage tank 12 and determines the distance to a reflector or reflective surface, i.e. the level of a liquid 14 held in the storage tank 12, by measuring how long after transmission of a burst of energy pulses, the echo is received. Known level measurement systems 10 utilize ultrasonic pulses, pulse radar signals, or microwave energy signals.

The level measurement instrument 10 comprises a transducer 16 (e.g. an ultrasonic transmitter/receiver or a microwave waveguide ), a microcontroller unit (not shown), and an analog-to-digital converter (not shown). In some configurations, the level measurement instrument 10 is remotely coupled via an analog or digital communication interface (not shown). The transducer 16 is coupled to the microcontroller unit through a transmitter. The microcontroller unit uses the transmitter to excite the transducer 16 to emit energy waves, i.e. ultrasonic or microwave pulses. The reflected or echo pulses are received by the transducer 16 and converted into an electrical signal in a receiver.

The level measurement instrument 10 is installed in the container 12, for example a tank, containing a material, such as the liquid 14, with a level determined by the top surface of the liquid 14. The top surface of the liquid 14 provides a reflective surface or reflector, indicated by reference 18, which reflects the pulse (e.g. ultrasonic or microwave) generated from the emitter on the transducer 16. The reflected pulse is coupled by the transducer 16 and converted by the receiver into an electrical signal which takes the form of a receive echo pulse waveform. The received echo pulse is sampled and digitized by an A/D converter (not shown) for further processing by the microcontroller unit. The microcontroller unit executes an algorithm which identifies and verifies the echo pulse and calculates the range of the reflective surface 18, i.e. the time it takes for the reflected pulse, i.e. echo pulse, to travel from the reflective surface 18 to the receiver at the transducer 16. From this calculation, the distance to the surface of the liquid 14 and thereby the level of the liquid is determined. The microcontroller also controls the transmission of data and control signals through the communication interface if one is installed. The microcontroller is suitably programmed to perform these operations as will be within the understanding of those skilled in the art. The detailed operation of level measurement systems 10, or other types of electronic process control equipment, will be apparent to those skilled in the art and as such does not form part of the invention.

Figure 3:
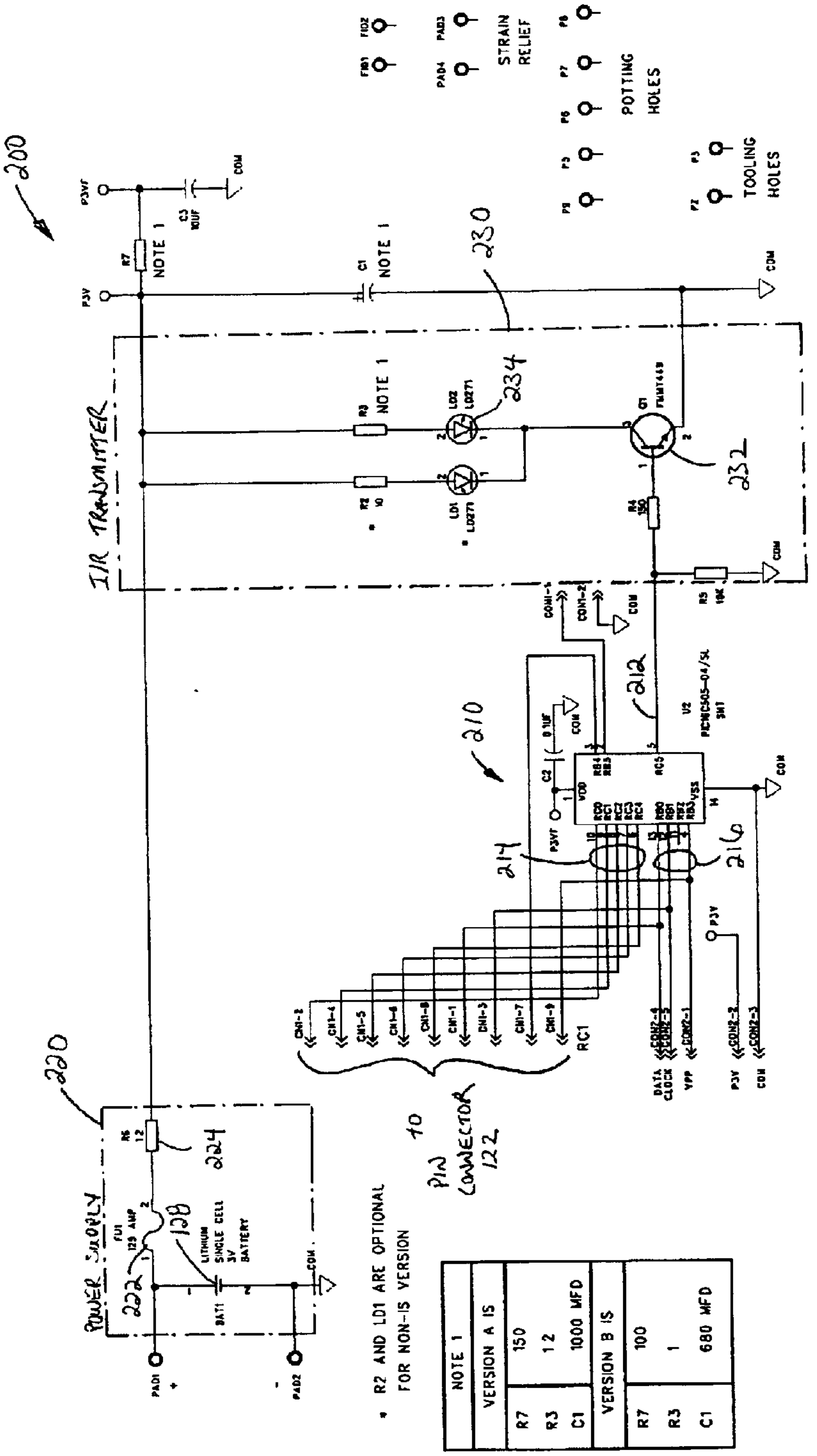
FIG. 3 is a schematic diagram showing an implementation of the electronic circuit for the intrinsically safe handheld programmer of FIG. 2.

In accordance with the present invention, the intrinsically safe portable programmer 100 communicates with the level measurement device 10 through a wireless communication channel or link denoted by reference 101. The wireless communication link 101 may comprise infrared, radio or other suitable wireless signaling. In the following description, the portable programmer 100 is described with reference to an infrared communication link. As shown in FIG. 1, the level measurement device 10 includes a wireless communication interface denoted by reference 20. The wireless communication interface 20 comprises a receiver, and may also include a transmitter if two-way communication between the level measurement device 10 and the portable programmer 100 is desired. Similarly, the intrinsically safe portable programmer 100 includes a wireless communication interface 102 comprising a transmitter 230 (FIG. 3). The wireless communication interface 102 may also include a receiver if two-way communication with the level measurement device 10 is desired.

Figure 2:
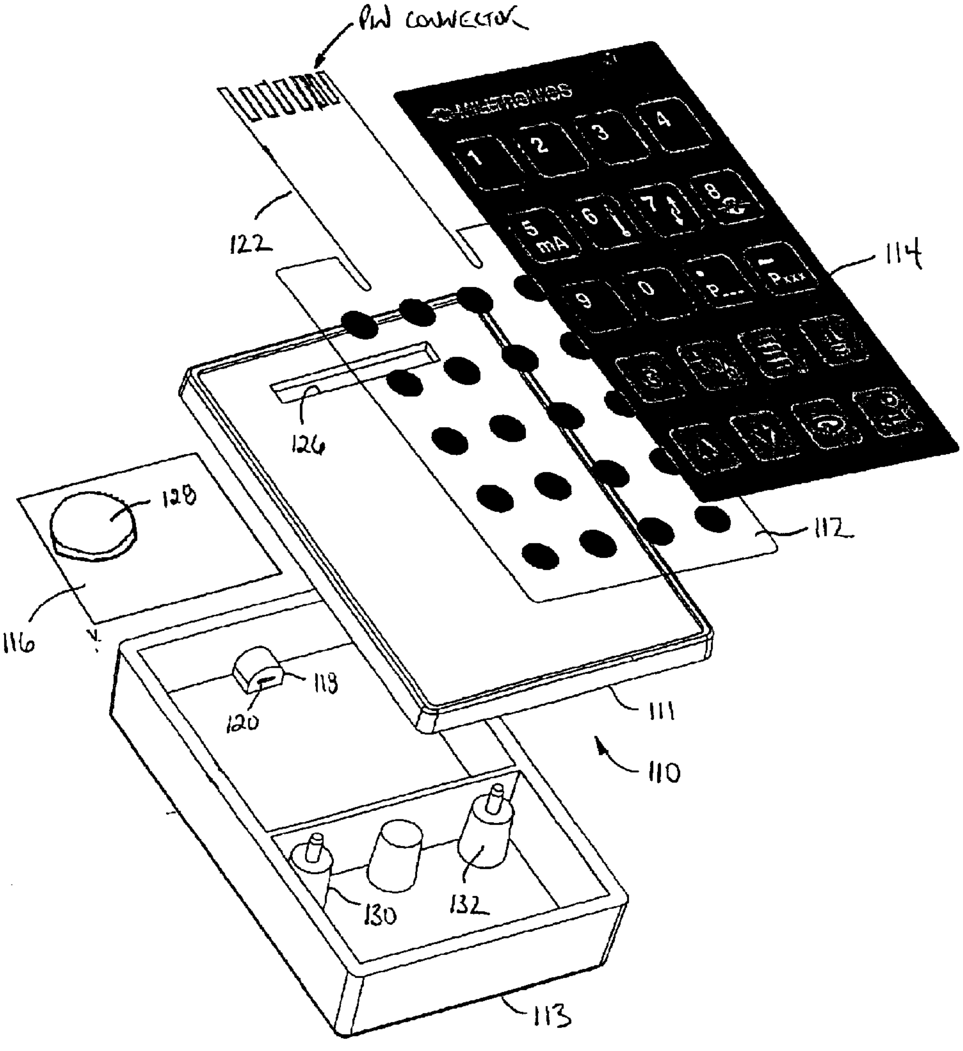
FIG. 2 is a diagrammatic exploded view of the intrinsically safe handheld programmer according to the present invention.

Reference is next made to FIG. 2, which shows in greater detail the intrinsically safe portable or handheld programmer 100 according to the present invention. As shown in FIG. 2, the portable programmer 100 comprises an enclosure 110, a keypad matrix 112, a keypad overlay 114, and an electronic circuit board 116.

The enclosure 110 comprises a lid enclosure 111 and a base enclosure 113. The lid 111 and base 112 enclosures are formed from general polymers polystyrene. The electronic circuit board 116 rests on standoff 118 in the base enclosure 113. The keypad matrix 112 includes a pin connector 122 which is soldered directly to the electronic circuit board 116. As shown in FIG. 2, the ribbon cable 122 fits through a slot 126 in the lid enclosure 111. The electronic circuit board 116 also carries a battery 128 which provides the power supply for the electronic circuitry as will be described in more detail below. The other side of the electronic circuit board 116 carries the electronic circuitry as described in FIG. 3. The standoff 118 includes a slot 120 for the infrared transmitter.

Reference is next made to FIG. 3, which shows an implementation of an electronic circuit 200 according to a preferred implementation for the handheld programmer 100. The electronic circuit 200 comprises a microcontroller 210, a power supply module 220, and an infrared transmitter stage 230. The microcontroller 210 is preferably implemented as a low power single chip microcontroller, such as the industry standard PIC type microcontrollers. As shown in FIG. 3, the microcontroller 210 has an output port 212 which drives the infrared transmitter stage 230. The microcontroller 210 is also configured with an output port 214 and an input port 216. The output port 214 comprises the scan lines for the keypad matrix 112, and the input port 216 comprises the sense lines for the keypad matrix 112. The scan lines 214 and the sense lines 216 are coupled to the electronic circuit board 116 via the pin connector 122 (FIG. 2). In known manner, the microcontroller 210 is suitably programmed to perform a function for key pad scanning operation.

Referring still to FIG. 3, the power supply module 220 comprises the battery 128 (FIG. 2), a fuse 222, and a resistor 224. The fuse 222 serves as a protective device, and the resistor 224 serves to limit the current drawn from the battery 128. In order to facilitate meeting the design criteria for an intrinsically safe device, the power supply module 220 is implemented as a low voltage design, preferably in the range of 3 Volts. In the preferred embodiment, the battery 128 comprises a single cell lithium 3V battery. The circuit 200 is designed to consume no power when not activated, and this feature allows the circuit 200 to operate with the single battery 128 for several years. As will be described below, this is important because the circuitry is potted to meet intrinsically safe requirements, and as such the battery 128 cannot be replaced.

The infrared transmitter stage 230 provides the wireless communication interface 102 (FIG. 1) for transmitting control signals to program and adjust parameters in the electronic process control device 10 (FIG. 1). As shown in Fig. 3, the infrared transmitter stage 230 comprises a driver transistor 232, and an infrared light emitting diode 234 (LED). Under the control of the firmware program in the microcontroller 210, the drive transistor 232 is turned on causing the infrared LED 234 to emit infrared radiation which is detected by the infrared receiver 20 on the electronic process control equipment 10 (FIG. 1).

The keypad 114 is configured to implement the control functions associated with the electronic process control equipment 10 and the microcontroller 210 is suitably programmed to scan the keypad 114 and implement these functions as will be within the understanding of one skilled in the art. For a level measurement device 10, these functions include numerical operating parameter entry, mode selection, display output programming.

Reference is made back to FIG. 2, and as shown the lid enclosure 111 is secured to the base enclosure 113 via appropriate snap fasteners 130 and 132 which may be molded into the base enclosure 113 as shown in FIG. 2. The keypad matrix 112 comprises a 4×5 key matrix. The keypad matrix 112 is coated with an adhesive coating on both top and bottom surfaces, for affixing the keypad matrix 112 to the top surface of the lid enclosure 111 and to the keypad overlay 114, respectively.

To make the handheld programmer 100 intrinsically safe, the electronic circuit board 116 in the base enclosure 113 is encapsulated with a two-part non-conductive epoxy, such as Stycast 2075 epoxy. The polymers polystyrene for the enclosure 110 is preferably grade ESD Electrafil PS-31/EC, 40% Carbon Black with a maximum surface resistivity of 5,000E+03 Ohms.

Following the construction specifications and directions as described, a handheld programmer 100 in conformance with standard Group II Electrical Apparatus for Gas Atmospheres, per section EN 50014, is achievable.

Advantageously, the intrinsically safe handheld programmer 100 according to the present invention can eliminate the need for a keypad or control panel on the enclosed electronic process control device (e.g. level measurement device 10 in FIG. 1). The keypad on the electronic process control device is replaced by an infrared receiver and a window over the receiver. Elimination of the keypad reduces the cost of the electronic process control device (for example the level measurement device 10), and the in the case of an enclosed electronic process control device, elimination of a keypad with explosion proof keys or switches further reduces cost. Another cost saving benefit arising from replacing the keypad with an infrared receiver and transmissive window is that the housing for the electronic process control device can be reduced in size resulting in a further cost reduction.

According to another aspect, the hand held programmer 100 may be used with a family or entire product line of electronic process control devices in an industrial installation as further illustrated in FIG. 1.

The present invention may be embodied in other specific forms without departing from the spirit or essential characteristics thereof. Certain adaptations and modifications of the invention will be obvious to those skilled in the art. Therefore, the presently discussed embodiments are considered to be illustrative and not restrictive, the scope of the invention being indicated by the appended claims rather than the foregoing description, and all changes which come within the meaning and range of equivalency of the claims are therefore intended to be embraced therein.

What is claimed is:

1. An intrinsically safe portable device for configuring the operation of a time of flight ranging system for making level measurements, said time of flight ranging system having a wireless communication receiver, said device comprising:

(a) an enclosure;

(b) an electronic circuit mounted in said enclosure, said electronic circuit including a low voltage power supply and a low power microcontroller for operating at a low voltage level to eliminate the incidence of sparking;

(c) a keypad coupled to said electronic circuit; and (d) a wireless transmitter responsive to said electronic circuit and operative to transmit control signals to the wireless communication receiver on the time of flight ranging system for controlling parameters of the time of flight ranging system.

2. The intrinsically safe portable device as claimed in claim 1, wherein said electronic circuit is encased in an epoxy inside of said enclosure, said epoxy providing a barrier against sparking in the electronic circuitry.

3. The intrinsically safe portable device as claimed in claim 2, wherein said enclosure is formed from general polymers polystyrene having a maximum surface resistivity of 5,000E+3 Ohms.

4. The intrinsically safe portable device as claimed in claim 1, wherein said wireless transmitter comprises an infrared transmitter.

5. The intrinsically safe portable device as claimed in claim 4, wherein said electronic circuit operates at a nominal voltage of 3 volts, and said low voltage power supply comprises a single cell lithium battery.

6. A time of flight ranging system for measuring the level of material in a container, said time of flight ranging system comprising:

(a) a time of flight ranging device having a wireless communication receiver, said time of flight ranging device having configurable parameters; and (b) an intrinsically safe portable device, including (i) an enclosure, (ii) an electronic circuit mounted in said enclosure, said electronic circuit including a low voltage power supply and a low power microcontroller for operating at a low voltage level to eliminate the incidence of sparking, (iii) a keypad coupled to said electronic circuit, and (iv) a wireless transmitter responsive to said electronic circuit and operative to transmit control signals to said wireless communication receiver on said time of flight ranging device for controlling said configurable parameters.

7. The time of flight ranging system as claimed in claim 6, wherein said electronic circuit is encased in an epoxy inside of said enclosure, said epoxy providing a barrier against sparking in the electronic circuitry.

8. The time of flight ranging system as claimed in claim 7, wherein said enclosure is formed from general polymers polystyrene having a maximum surface resistivity of 5,000E+03 Ohms.

9. The time of flight ranging system as claimed in claim 6, wherein said wireless transmitter comprises an infrared transmitter.

10. The time of flight ranging system as claimed in claim 9, wherein said electronic circuit operates at a nominal voltage of 3 volts, and said low voltage power supply comprises a single cell lithium battery.

11. The intrinsically safe portable device as claimed in claim 1, wherein said wireless transmitter comprises a radio transmitter.

12. The time of flight ranging system as claimed in claim 6, wherein said wireless transmitter comprises a radio transmitter.

13. The intrinsically safe portable device as claimed in claim 1, wherein said intrinsically safe portable device is configured to operate on enclosed electronic process control devices without keypads and control panels.

14. The time of flight ranging system as claimed in claim 6, wherein said time of flight ranging device is configured to use reflected energy pulses to determine a distance to a surface of a liquid or granular material.

15. An intrinsically safe portable device for configuring the operation of a level measurement system, said level measurement system having a wireless communication receiver, said device comprising:

(a) an enclosure;

(b) an electronic circuit mounted in said enclosure, said electronic circuit including a low voltage power supply and a low power microcontroller for operating at a low voltage level to eliminate the incidence of sparking;

(c) a keypad coupled to said electronic circuit; and (d) a wireless transmitter responsive to said electronic circuit and operative to transmit control signals to the wireless communication receiver on the level measurement system for controlling parameters of the level measurement system.

* * * * *